US006765512B2

(12) United States Patent
Mason et al.

(10) Patent No.: US 6,765,512 B2
(45) Date of Patent: Jul. 20, 2004

(54) EFFICIENT, TABLE-DRIVEN, INTEGER-BASED METHOD FOR APPROXIMATING DOWN SAMPLING OF WAVE DATA

(75) Inventors: Jack L Mason, Hillsboro, OR (US); Chi M Cheung, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/282,733

(22) Filed: Oct. 29, 2002

(65) Prior Publication Data

US 2004/0080438 A1 Apr. 29, 2004

(Under 37 CFR 1.47)

(51) Int. Cl.[7] ................................................ H03M 7/00
(52) U.S. Cl. ......................................... 341/61; 708/313
(58) Field of Search ........................... 341/61; 708/313, 708/316, 103

(56) References Cited

U.S. PATENT DOCUMENTS 5,199,046 A * 3/1993 Ling .......................... 375/222
6,275,836 B1 * 8/2001 Lu ............................ 708/313

* cited by examiner

*Primary Examiner*—Brian Young
*Assistant Examiner*—Joseph Lauture
(74) *Attorney, Agent, or Firm*—John F. Kacvinsky

(57) ABSTRACT

A table-driven, integer-based method for approximating down sampling of wave data is disclosed. This method provides an efficient approximation of the desired down sampled wave data without a significant impact to overall system performance. Integer calculations are exploited by: (1) multiplying all values of $t_i$ by a large enough value to include all significant portions of the decimal value; (2) making all values of Δt integer values; and (3) using integer arithmetic for most calculations of Δt and $t_i$. The following static integer tables assist in the final calculations: (1) T[ ], where each element contains the value of $t_i$ divided by Δt and multiplied by a large enough value, M, to place all significant decimal values to the left of the decimal; and (2) D[ ], where each element contains the number of samples of $Sa_n$ to drop before arriving at a useable $Sa_n$ and $Sa_{n+1}$ pair.

30 Claims, 3 Drawing Sheets

EFFICIENT, TABLE-DRIVEN, INTEGER-BASED METHOD FOR APPROXIMATING DOWN SAMPLING OF WAVE DATA

BACKGROUND

1. Technical Field

Embodiments described herein are directed to an efficient, table-driven, integer-based method for approximating down sampling of wave data. Specifically, an algorithm that provides efficient approximation of the resultant down sampled data is disclosed.

2. Related Art

Efficient algorithms for down sampling wave data are essential when wave data is captured for real-time applications. Failure to do so can produce noticeable and shattering results in such applications. As such, an algorithm that provides efficient approximation of resultant down sampled data would prove beneficial.

Currently, problems arise in down sampling original data while maintaining throughput required by the application. For instance, due to the wave properties of analog data, down sampling to exact values often requires complex and time-consuming mathematical calculations. Such calculations can adversely affect a software component's ability to maintain the required throughput.

BRIEF DESCRIPTION OF THE DRAWINGS

A detailed description of embodiments of the invention will be made with reference to the accompanying drawings, wherein like numerals designate corresponding parts in the several figures.

DETAILED DESCRIPTION

Figure 1:
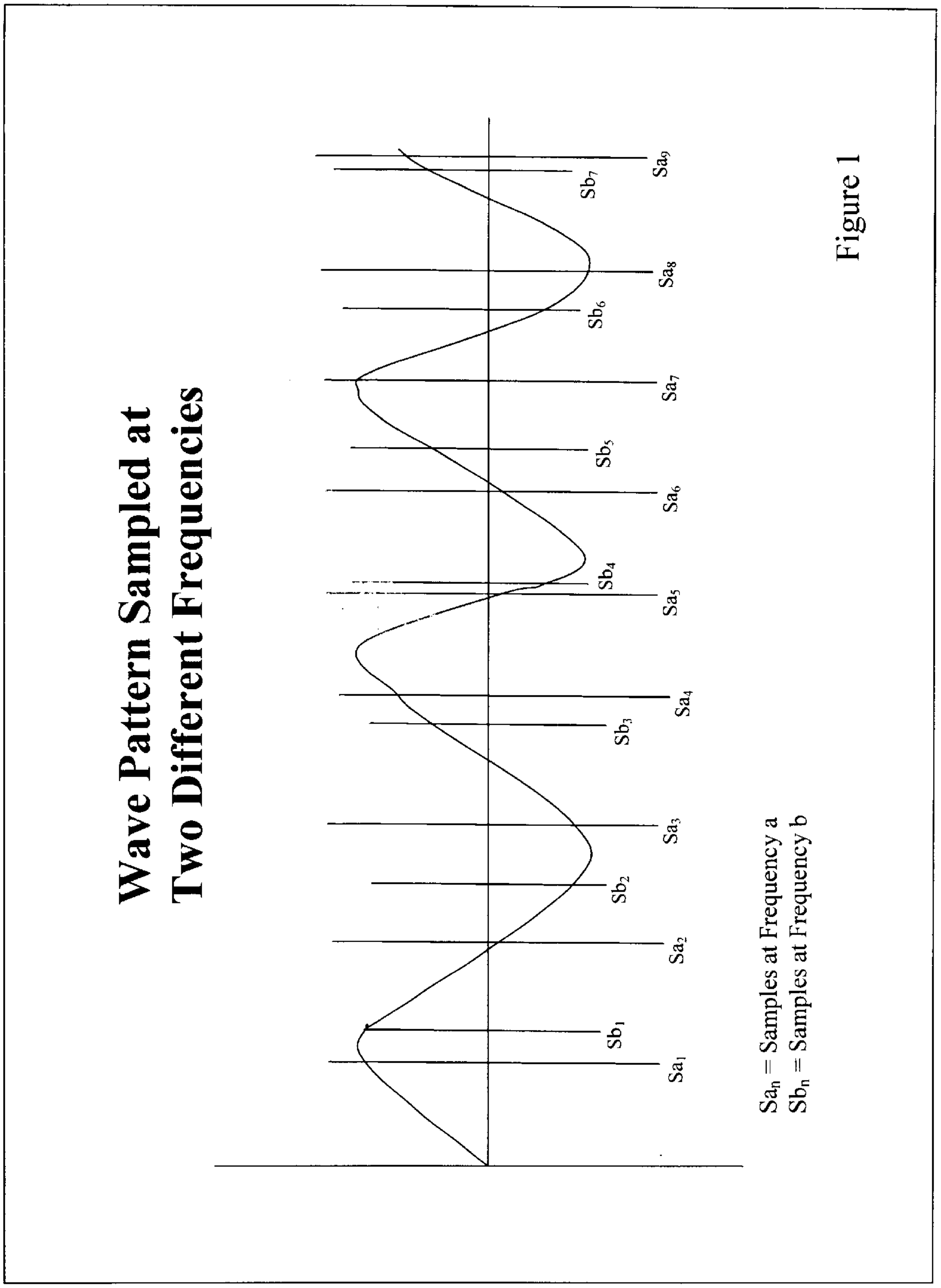
FIG. 1 is a graph that illustrates a wave pattern sampled at two different frequencies according to an embodiment of the present invention.

The following paragraphs describe a table-driven, integer-based method for approximating down sampling of wave data. FIG. 1 shows a wave pattern, that was originally sampled at frequency A, as represented by the samples marked at points $Sa_1$ through $Sa_9$. A second sampling frequency B is represented by samples marked at points $Sb_1$ through $Sb_7$. Frequency A may be, for example, data provided from a coder/decoder ("codec") or some digital to analog converter. Frequency B may be data required by a real-time application. Within an acceptable percentage of error such as for example, +/−0.02%, these two frequencies converge.

Problems often arise in down sampling original data while maintaining the throughput required by the application. Because of wave properties of analog data, down sampling to exact values often requires complex and time-consuming mathematical calculations. Such calculations can adversely affect a software component's ability to maintain the required throughput.

Figure 2:
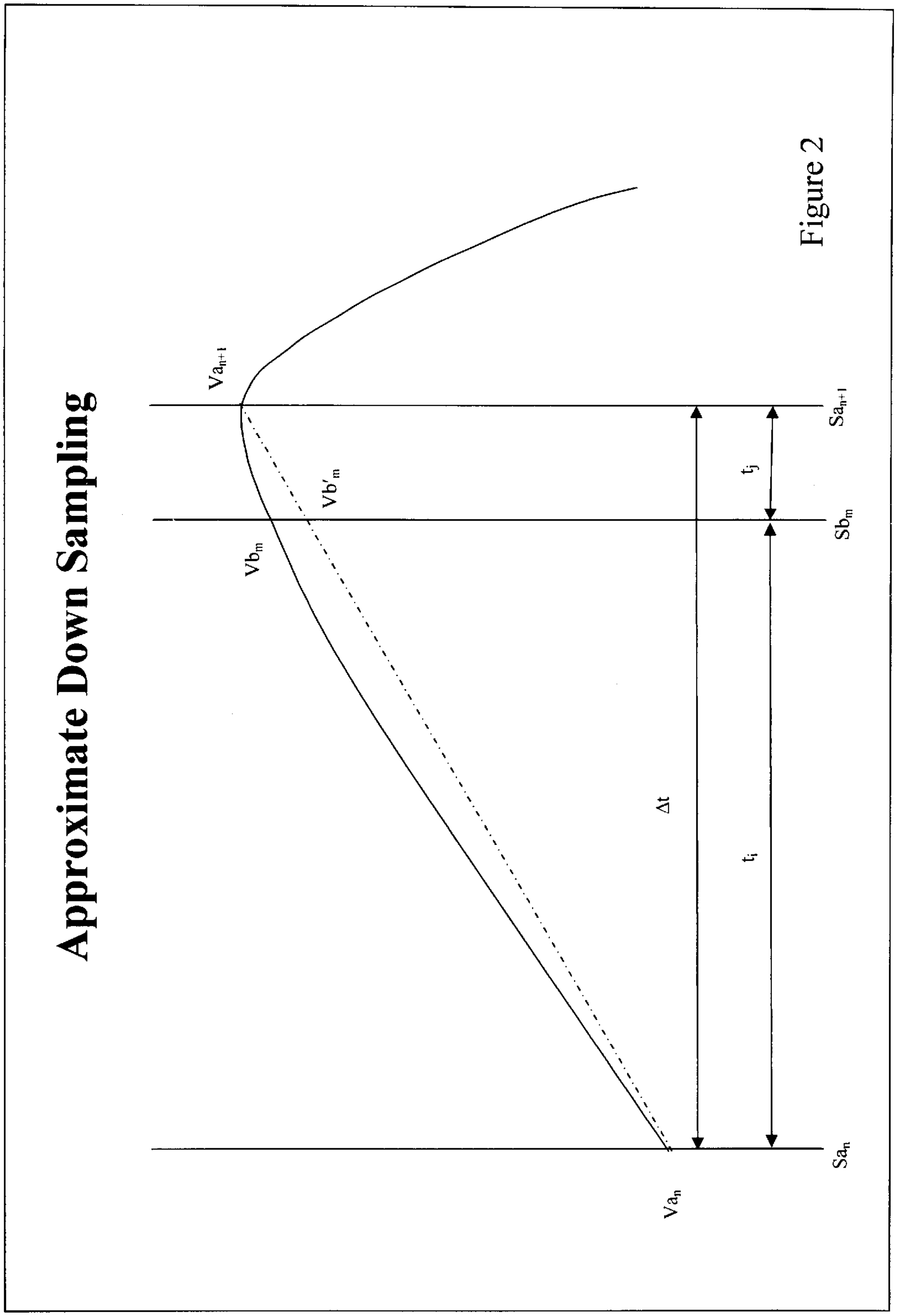
FIG. 2 is a graph that illustrates approximate down sampling according to an embodiment of the present invention.

FIG. 2 shows a wave pattern originally sampled at $Sa_n$ and at $Sa_{n+1}$ over a period of time, Δt, with values $Va_n$ and $Va_{n+1}$. The point at which $Sb_m$ should be sampled is shown at time $t_i$, thereby providing $Vb_m$, where $\Delta t=t_i+t_j$. To approximate the value at $Sb_m$ so as to provide $Vb'_m$, the following data must be known: (a) the value of Δt; (b) the value of $t_i$; (c) the value of $Va_n$; and (d) the value of $Va_{n+1}$. From the values of $Va_n$ and $Va_{n+1}$, ΔVa can then be calculated. The percentage of time when $Sb_m$ should be sampled is calculated by dividing $t_i$ by Δt. Applying this scalar value to ΔVa provides an approximate value for $Vb'_m$.

To further reduce the computational time in deriving $Vb'_m$, integer-based tables are used. The period nature of frequencies A and B enables the calculation of $t_i$ in relation to the necessary samples at $Sa_n$ and $Sa_{n+1}$. Such a data point necessitates an additional table for decimation, the dropping of unnecessary original samples. FIG. 1 illustrates a scenario ripe for decimation. That is, no sample, $Sb_x$ is needed between samples $Sa_4$ and $Sa_5$.

Integer calculations are exploited by: (1) multiplying all values of $t_i$ by a large enough value to include all significant portions of the decimal value; (2) making all values of Δt integer values; and (3) using integer arithmetic for most, if not all, calculations of Δt and $t_i$.

The following static integer tables assist in the final calculations: (1) T[ ], where each element contains the value of $t_i$ divided by Δt and multiplied by a large enough value, M, to place all significant decimal values to the left of the decimal; and (2) D[ ], where each element contains the number of samples of $Sa_n$ to decimate before arriving at a useable $Sa_n$ and $Sa_{n+1}$ pair. In essence, each element of T[ ] represents the percentage of time $t_i$ relative to Δt.

After the appropriate sample decimation is applied via DC [ ], $Va_n$ and $Va_{n+1}$ remain as values from the data source. ΔVa is then determined by subtracting the numerically smaller value from the larger value of the Va pair. After ΔVa is determined, the value for $Vb'_m$ is calculated by multiplying ΔVa by the value in T[ ] and then dividing the result by M. This algorithm provides an efficient approximation of the desired down sampled wave data without a significant impact to overall system performance.

Figure 3:
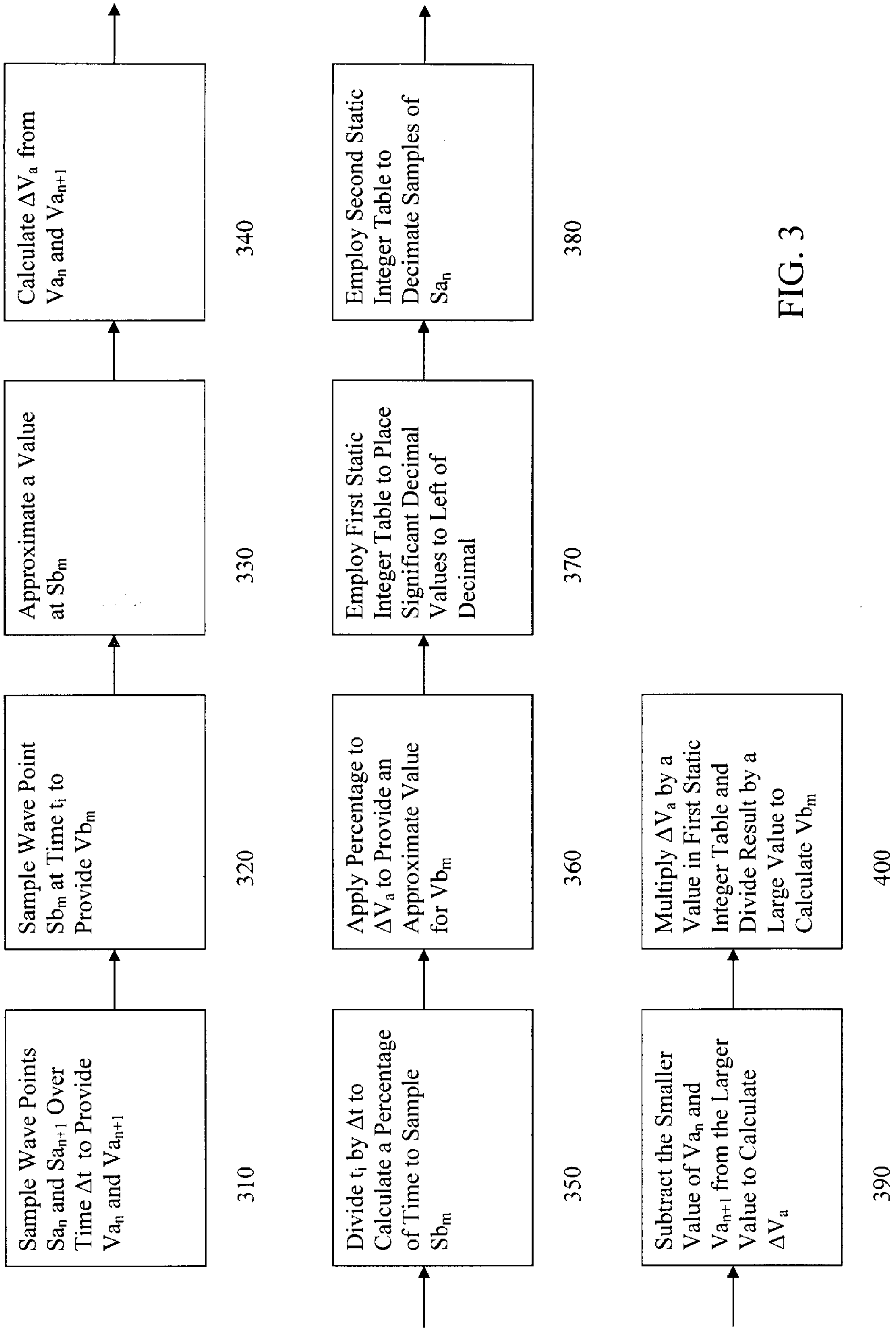
FIG. 3 is a flowchart that illustrates operations involved to achieve a table-driven, integer-based approximation for down sampling wave data according to an embodiment of the present invention.

FIG. 3 illustrates operations involved in achieving an approximation of wave data through a table-driven, integer-based method. As shown in operation 310, a wave pattern is sampled at wave points $Sa_n$ and $Sa_{n+1}$ over a period of time Δt to provide values $Va_n$ and $Va_{n+1}$. Next, as depicted in operation 320, a wave point $Sb_m$ is sampled at time $t_i$ to provide value $Vb_m$. A value at $Sb_m$ is then approximated as illustrated in operation 330. ΔVa is calculated from the values $Va_n$ and $Va_{n+1}$, as shown in operation 340. In operation 350, a percentage of time to sample $Sb_m$ is calculated by dividing $t_i$ by Δt. The percentage is then applied to ΔVa to give an approximate value for $Vb'_m$, as in operation 360.

In addition, at operation 370, a first static integer table is employed, in which each element contains the value of $t_i$ divided by Δt, multiplied by a sufficiently large value, M, to place significant decimal values to the left of a decimal. At operation 380, a second static integer table is used, in which each element contains a plurality of samples of $Sa_n$ to decimate before arriving at a useable $Sa_n$ and $Sa_{n+1}$ pair. ΔVa is then determined by subtracting the smaller value of $Va_n$ and $Va_{n+1}$ from the larger value, as depicted in operation 390. At last, in operation 400, $Vb'_m$ is calculated by multiplying ΔVa by a value in the first static integer table and dividing by the sufficiently large value, M.

While the above description refers to particular embodiments of the present invention, it will be understood to those of ordinary skill in the art that modifications may be made without departing from the spirit thereof. The accompanying claims are intended to cover any such modifications as would fall within the true scope and spirit of the embodiments of the present invention. The presently disclosed embodiments are therefore to be considered in all respects as illustrative and not restrictive; the scope of the embodiments of the invention being indicated by the appended claims, rather than the foregoing description. All changes that come within the meaning and range of equivalency of the claims are therefore intended to be embraced therein.

What is claimed is:

1. A method of approximating wave data, comprising:

sampling a wave pattern at a first wave point and at a second wave point over a delta-time to provide a first value and a second value at a first frequency;

sampling an approximate wave point at a first time period to provide a third value at a second frequency;

approximating a fourth value at the approximate wave point;

calculating a delta-value from the first value at the first frequency and the second value at the first frequency;

determining a percentage of time to sample the approximate wave point by dividing the first time period by the delta-time;

applying the percentage determined to the delta-value to provide the approximate fourth value at the second frequency; and using a plurality of static integer tables to assist in final calculations.

2. The method of approximating wave data of claim 1, wherein the delta-time equals the sum of the first time period and a second time period, and the first time period is calculated in relation to the first wave point and the second wave point.

3. The method of approximating wave data of claim 1, wherein the delta-time is an integer value and calculations for the delta-time and the first time period use integer arithmetic.

4. The method of approximating wave data of claim 1, wherein in a first static integer table, each element represents a percentage of the first time period relative to the delta-time and contains a value of the first time period divided by the delta-time multiplied by a sufficiently large value to place significant decimal values to the left of a decimal, and in a second static integer table, each element contains a plurality of samples of the first wave point to decimate before arriving at a useable first wave point and second wave point pair.

5. The method of approximating wave data of claim 4, wherein the delta-value is determined by subtracting a smaller of the first value at the first frequency and the second value at the first frequency from a larger of the first value at the first frequency and the second value at the first frequency.

6. The method of approximating wave data of claim 5, wherein the approximate fourth value at the second frequency is calculated by multiplying the delta-value by a value in the first static integer table and dividing by the sufficiently large value.

7. An article, comprising:

a storage medium having stored thereon instructions that when executed by a machine result in the following:

sampling a wave pattern at a first wave point and at a second wave point over a delta-time to provide a first value and a second value at a first frequency;

sampling an approximate wave point at a first time period to provide a first value at a second frequency;

approximating a fourth value at the approximate wave point;

calculating a delta-value from the first value at the first frequency and the second value at the first frequency;

determining a percentage of time to sample the approximate wave point through dividing the first time period by the delta-time;

applying the percentage determined to the delta-value to provide the approximate fourth value at the second frequency; and using a first and a second static integer table to assist in final calculations.

8. The article of claim 7, wherein the delta-time equals the sum of the first time period and a second time period, and the first time period is calculated in relation to the first wave point and the second wave point.

9. The article of claim 7, wherein the delta-time is an integer value, and calculations for the delta-time and the first time period use integer arithmetic.

10. The article of claim 7, wherein in the first static integer table, each element represents a percentage of the first time period relative to the delta-time and contains a value of the first time period divided by the delta-time, multiplied by a sufficiently large value to place significant decimal values to the left of a decimal.

11. The article of claim 10, wherein the delta-value is determined by subtracting a smaller of the first value at the first frequency and the second value at the first frequency from a larger of the first value at the first frequency and the fourth value at the second frequency, and the approximate wave point value is calculated by multiplying the delta-value by a value in the first static integer table and dividing by the sufficiently large value.

12. The article of claim 7, wherein in the second static integer table, each element contains a plurality of samples of the first wave point to decimate before arriving at a useable first and second wave point pair.

13. A method of approximating wave data, comprising: sampling a wave pattern at wave points $Sa_n$ and $Sa_{n+1}$ over a period of time $\Delta t$ to provide values $Va_n$ and $Va_{n+1}$;

sampling a wave point $Sb_m$ at time $t_i$ to provide a value $Vb_m$;

approximating a value at $Sb_m$;

calculating a $\Delta Va$ from the values $Va_n$ and $Va_{n+1}$;

determining a percentage of time to sample the value at $Sb_m$ by dividing time $t_i$ by the $\Delta t$; and applying the percentage determined to the $\Delta Va$ to provide an approximate value for a value $Vb'_m$.

14. The method of approximating wave data of claim 13, wherein the $\Delta t$=time $t_i$+time $t_j$.

15. The method of approximating wave data of claim 13, wherein time $t_i$ is calculated in relation to the wave points $Sa_n$ and $Sa_{n+1}$.

16. The method of approximating wave data of claim 13, wherein a calculation is exploited by having a value of time $t_i$ multiplied by a sufficiently large value to include all significant portions of a decimal value.

17. The method of approximating wave data of claim 13, wherein the $\Delta t$ is an integer value.

18. The method of approximating wave data of claim 13, wherein calculations for the $\Delta t$ and time $t_i$ use integer arithmetic.

19. The method of approximating wave data of claim 13, wherein a plurality of static integer tables assist in final calculations.

20. The method of approximating wave data of claim 19, wherein in a first static integer table, each element contains a value of time $t_i$ divided by the $\Delta t$, multiplied by a sufficiently large value to place significant decimal values to the left of a decimal.

21. The method of approximating wave data of claim 20, wherein each element represents a percentage of time $t_i$ relative to the $\Delta t$.

22. The method of approximating wave data of claim 21, wherein in a second static integer table, each element contains a plurality of samples of wave point $Sa_n$ to decimate before arriving at a useable $Sa_n$ and $Sa_{n+1}$ wave point pair.

23. The method of approximating wave data of claim 22, wherein the $\Delta Va$ is determined by subtracting a smaller of the values $Va_n$ and $Va_{n+1}$ from a larger of the values $Va_n$ and $Va_{n+1}$.

24. The method of approximating wave data of claim 23, wherein the value $Vb'_m$ is calculated by multiplying the $\Delta Va$ by a value in the first static integer table and dividing by the sufficiently large value.

25. An article, comprising:

a storage medium having stored thereon instructions that when executed by a machine result in the following:

sampling a wave pattern at wave points $Sa_n$ and $Sa_{n+1}$ over a $\Delta t$ to provide values $Va_n$ and $Va_{n+1}$;

sampling a wave point $Sb_m$ at time $t_i$ to provide a value $Vb_m$;

approximating a value at $Sb_m$;

calculating a $\Delta Va$ from the values $Va_n$ and $Va_{n+1}$;

determining a percentage of time to sample the value at $Sb_m$ through dividing time $t_i$ by the $\Delta t$;

applying the percentage determined to the $\Delta Va$ to provide an approximate value for a value $Vb'_m$; and using static integer tables to assist in final calculations.

26. The article of claim 25, wherein the $\Delta t$=time $t_i$+time $t_j$, and time $t_i$ is calculated in relation to the wave points $Sa_n$ and $Sa_{n+1}$.

27. The article of claim 25, wherein the $\Delta t$ is an integer value, and calculations for the $\Delta t$ and time $t_i$ use integer arithmetic.

28. The article of claim 25, wherein in a first static integer table, each element represents a percentage of time $t_i$ relative to the $\Delta t$ and contains the value of time $t_i$ divided by the $\Delta t$, multiplied by a sufficiently large value to place significant decimal values to the left of a decimal.

29. The article of claim 28, wherein the $\Delta Va$ is determined by subtracting a smaller of the values $Va_n$ and $Va_{n+1}$ from a larger of the values $Va_n$ and $Va_{n+1}$, and the value $Vb'_m$ is calculated by multiplying the $\Delta Va$ by a value in the first static integer table and dividing by the sufficiently large value.

30. The article of claim 25, wherein in a second static integer table, each element contains a plurality of samples of wave point $Sa_n$ to decimate before arriving at a useable $Sa_n$ and $Sa_{n+1}$ wave point pair.

* * * * *